United States Patent
Bhandari (10) Patent No.: US 6,400,217 B1
(45) Date of Patent: Jun. 4, 2002

(54) INTEGRATED CIRCUIT HAVING A FILTER WITH CHARGE BALANCING SCHEME TO REDUCE TRANSIENT DISTURBANCES

(75) Inventor: Sanjay Manohar Bhandari, Sunnyvale, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/469,873

(22) Filed: Dec. 22, 1999

Related U.S. Application Data (63) Continuation-in-part of application No. 09/407,776, filed on Sep. 28, 1999.

(51) Int. Cl.[7] .............................................. H03K 5/00
(52) U.S. Cl. ...................................... 327/554; 327/337
(58) Field of Search ................................ 327/554, 337, 327/362, 112, 111, 552, 341, 384

(56) References Cited

U.S. PATENT DOCUMENTS

| | | | | |
|---|---|---|---|---|
| 3,697,985 A | * | 10/1972 | Lunn | 329/101 |
| 4,185,246 A | | 1/1980 | Schroeder | 328/165 |
| 4,647,762 A | * | 3/1987 | Chown | 250/14 |
| 5,309,112 A | | 5/1994 | Lee | 328/151 |
| 5,463,394 A | | 10/1995 | Sun | 341/136 |
| 5,724,000 A | | 3/1998 | Quinn | 327/554 |
| 5,841,310 A | | 11/1998 | Kalthoff et al. | 327/337 |
| 5,933,038 A | | 8/1999 | Klass | 327/208 |
| 5,943,290 A | | 8/1999 | Robinson et al. | 365/233 |
| 6,091,616 A | * | 7/2000 | Jacobs et al. | 363/127 |
| 6,147,523 A | * | 11/2000 | Hojabri | 327/110 |

\* cited by examiner

*Primary Examiner*—Dinh T. Le
(74) *Attorney, Agent, or Firm*—John Vodopia (57) ABSTRACT

An integrated circuit includes a filter with switched capacitors to dynamically adjust a corner frequency of the filter. Such dynamically adjustable filters are typically included in circuits to reduce noise, and consequently such filters should not themselves generate noise. An equalization circuit is included in the filter to equalize the potential on each terminal of the switched capacitors prior to being switched into circuit, thereby removing a source of transient current. Another source of noise is a transient current induced by the application of control signals to the transistors used to switch the capacitors into circuit. A compensation circuit is included which generates a compensation current of opposite sense and substantially the same magnitude as the induced transient currents, to thereby effectively cancel noise at the filter output.

17 Claims, 7 Drawing Sheets

INTEGRATED CIRCUIT HAVING A FILTER WITH CHARGE BALANCING SCHEME TO REDUCE TRANSIENT DISTURBANCES

CROSS-REFERENCE TO RELATED APPLICATIONS

This application is a continuation-in-part of U.S. application Ser. No. 09/407,776 filed Sep. 28, 1999 entitled "CIRCUIT FOR REDUCTION AND OPTIMIZATION OF WRITE-TO-READ SETTLING TIMES IN MAGNETIC MEDIUM STORAGE DEVICES" of Sanjay Bhandari and David Allouche.

BACKGROUND OF THE INVENTION

1. Field of the Invention

The invention relates generally to filter circuits with time variant characteristics controlled by switched capacitor networks. More particularly, the invention concerns improvements which minimize switching transients in such networks and filter circuits.

2. Description of the Prior Art

Filters in the integrated circuit arts are known which have time variant characteristics. One type of filter has a corner frequency which is variable from one frequency to another frequency, and is useful to remove noise from a signal. As used herein, "noise" is defined as any undesired signal component caused due to parasitic coupling or switching of various nodes or components in a circuit. This type of filter is useful where the noise varies in frequency in a time dependent manner. When the characteristics of the noise are generally known, the time variant properties of the filter can be designed to best filter the noise while minimizing the adverse impact on the desired information in the signal.

One exemplary application of time variant filters is in improving the write-to-read settling time in the read channel of magnetic disk storage devices, or hard drives, for computers. This is an important application because it impacts directly with drive capacity. Write-to-read settling time is defined to be the time required for the read channel to settle and be able to read the next servo field after the write channel has stopped writing. The gap on the magnetic disk between the end of the write sector and the start of the servo field is wasted area and hence should be minimized.

The exact duration and nature of write-to-read disturbances are somewhat unpredictable. It depends on the assembly of the heads, sensors, flexible cable, as well as other noise contributing sources in the read channel, and hence varies between models of hard disk drives assembled by a manufacturer of such devices. When designing a preamplifier IC, the designer must model the interference sources, based on design data provided by the disk drive manufacturer as well as past experience (if any) with other models of that manufacturer, to design a suitable filter for interference suppression for the read channel. Once the noise characteristic is known, a circuit designer can design a filter which has for example, a time variant corner which generally tracks the frequency response of the noise signal desired to be eliminated.

A known technique for changing the characteristics of filters is to include a switched capacitor network in the filter. The corner frequency is changed by selectively switching different capacitances into circuit with the filter. The present inventors have recognized that the switched capacitor network is itself a source of noise.

An object of the invention, among others, is to reduce the noise generated by switched capacitor networks, and particularly as applied in time variant filters.

SUMMARY OF THE INVENTION

Generally speaking, according to one aspect of the invention, an integrated circuit includes a filter having an adjustable corner frequency. The filter includes at least one capacitive device switchable into circuit with the filter to adjust the corner frequency. An equalization circuit sets, prior to the capacitive device being switched into circuit with the filter, the terminals of the capacitive device to at least substantially the same electric potentials, and which electric potentials are at least substantially equal to the potentials to which these terminals are connected immediately after the capacitive device is switched into circuit with the filter circuit. This minimizes transient currents during switching of said capacitive device into the filter. This aspect of the invention is based on the recognition that if a voltage exists across the terminals of a capacitor when it is switched into the filter circuit, and if the potential of either of the terminals is changed as result of this switching, that it will cause a transient current to appear at the output of the filter. Since the purpose of a dynamically adjustable filter is typically to reduce noise in a system, the generation of additional noise by inclusion of the filter in the system should be avoided. Thus, the present invention provides a technique to drastically reduce one source of noise from switched capacitor networks and filters with which they are used.

Another aspect of the invention provides isolation for the switched capacitive devices during the precharging phase. Since the capacitive devices are selected to provide different predetermined corner frequencies, it is undesirable for these devices to influence the corner frequency. By providing isolation for the switched capacitive devices in the circuit, the effect on the corner frequency of the filter by each isolated device prior to such device being selectively switched into the circuit is substantially reduced. In one embodiment, the isolation is provided by serially coupled emitter-followers which form part of the equalization circuit. The emitter-followers reduce the reflection of an unswitched capacitive device by a factor of $\beta^2$, where $\beta$ is the well known transistor constant for the small signal forward gain.

According to yet another aspect of the invention, a controllable switch is coupled to a capacitive device of the network to switch the capacitive device into circuit with the filter. The switch has a switch capacitance and receives a control signal which induces a transient current in the filter circuit when the control signal is applied to the switch. The filter further includes a compensation circuit to generate a current opposite in sense and of substantially equal magnitude to the transient current, to thereby at least substantially cancel the transient current at the filter output. This aspect of the invention is based on the recognition by the present inventors that another source of unwanted noise in dynamically adjustable filter circuits is caused by the application of a control signal to switching devices in the filter, which in conjunction with a capacitance of the switch, such as the gate capacitance in a MOS transistor, induces a transient current which adversely affects filter performance.

According to an embodiment, the compensation circuit includes a capacitive compensation device, the capacitive compensation device receiving a compensation signal concurrently with the application of the control signal to the switch to generate the compensation current. The compensation device may be a MOS transistor having its source coupled to its drain, which increase the capacitance of the transistor, thereby allowing a smaller device. An advantage of this embodiment is that the compensation current is controllable through selection of the compensation signal applied to the gate of the MOS transistor.

Another aspect of the invention concerns methods of operating a switched capacitor network and a filter to implement the above-described techniques.

These and other object, features and advantages of the invention will become apparent with reference to the following detailed description and the drawings.

DETAILED DESCRIPTION OF THE PREFERRED EMBODIMENTS

Figure 1:
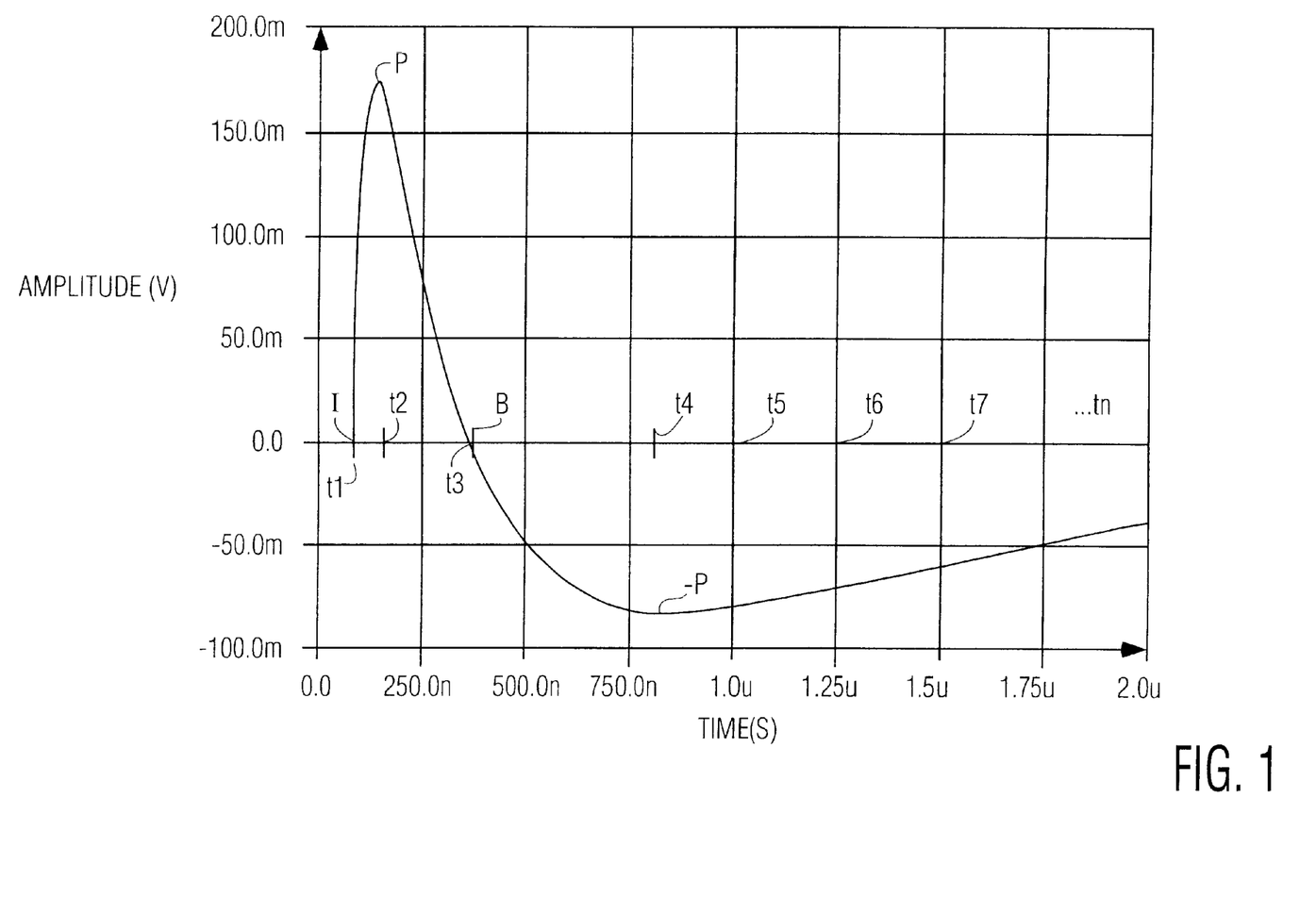
FIG. 1 is a graph of a typical signal waveform, at the output of a preamplifier, having time-dependent decay characteristics, after the write to read transition.

FIG. 1 is a graph which illustrates a typical voltage waveform of a signal operating at the output of a preamplifier after write-to-read transition. This waveform also depicts a typical signature of a disturbance that has to be filtered with a filter having time-dependent characteristics. At time "t1", the write-to-read transition occurs and the disturbance rapidly peaks to a peak P during time period t1–t2. The disturbance rapidly decays through zero volts at time t3, to a negative peak ("–P") at a time t4. Over a period of time (e.g. periods t5, t6, . . . tn), on the order of micro-seconds, the disturbance has a long tail and decays from the negative peak towards zero volts. The frequency of the waveform is initially high (t1, t2) and decreases in the direction from left to right (towards tn) in FIG. 1. The waveform of FIG. 1 is for illustration purposes only.

As used herein, a "pole" is defined as the value of the complex variable $s=j\omega=j2\pi f$ for which the transfer function $A(s)=$(infinity). A "zero" is defined as the value of s, where $A(s)=0$. Alternatively, as the context requires, the pole or zero is also referred to in terms of the frequency at which the transfer function is infinity or zero, respectively.

Figure 2:
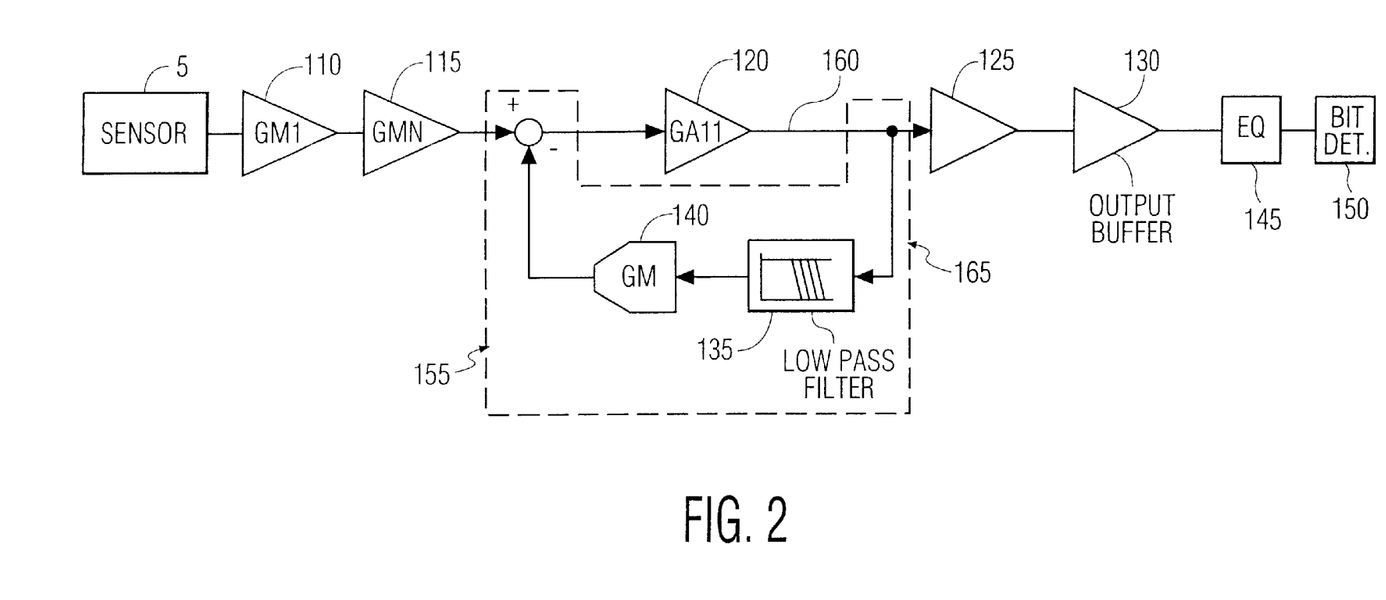
FIG. 2 is a simplified block diagram of a preamplifier integrated circuit having a low pass filter 135 in a feedback path having a time-dependent low corner frequency.

FIG. 2 illustrates a read channel 100 of a preamplifier IC for a magnetic hard disk drive. The read channel includes a sensor 5 which generates a signal from information stored on the magnetic medium of the drive. The signal is amplified by a series string of amplifiers including a first stage 110, a second stage 115 and a third stage 125. An output buffer 130 connected to gain stage 125 feeds an equalizer 145 and a bit detector 150. A filter is implemented in the forward path 160 by a low pass filter ("LPF") 135 in a feedback path 165 around a unity gain stage 120 in the forward path. The unity gain stage is implemented as an emitter-follower.

Figure 3:
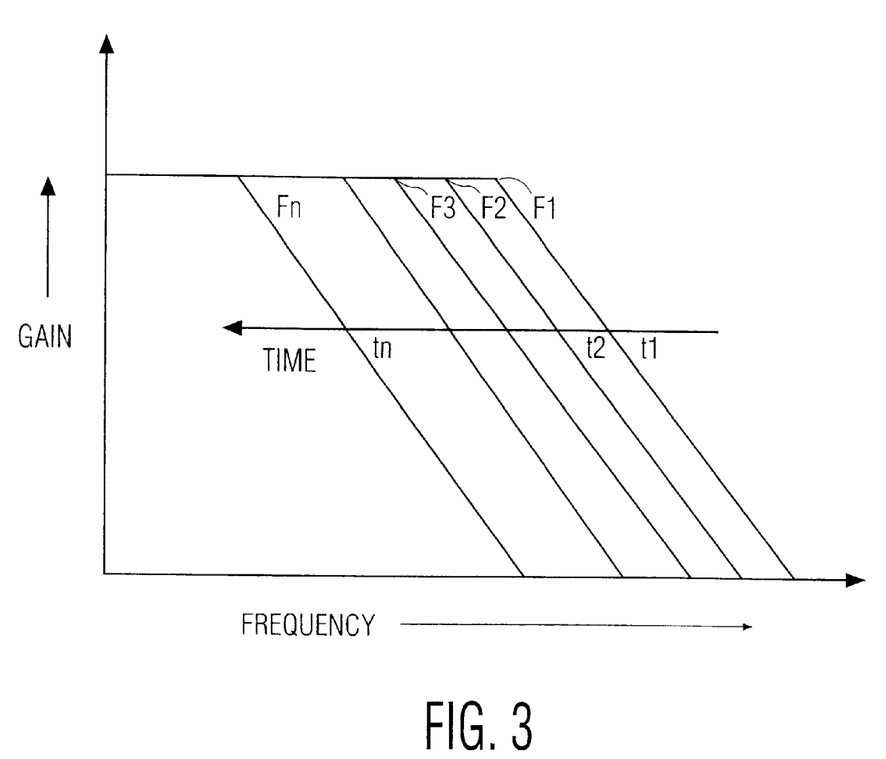
FIG. 3 is a graph of the gain of a filter having a time-dependent frequency characteristic.

FIG. 3 shows the desired frequency response of the LPF 135 in the time domain. The corner frequency Fc of the filter is moved from a high value F1 to a lower value Fn over a time period t1 through Tn. It is to be understood that different variations of Fc in the time domain may be used for different applications; the present example merely being one that is suitable for the type of signal illustrated in FIG. 1 which is encountered with write-to-read disturbances on magnetic disk drives. The LPF 135, when in closed loop configuration, introduces a zero in the forward path 160. The location of this zero is varied from a high frequency $F_1$ to a low frequency $F_n$ as a result of varying the corner frequency in the feedback path from a high frequency F1 to the lower frequency Fn.

After a READ signal is switched ON to activate the read channel 100, for an initial small duration of time (of the order of 100ns) when the transients from the read front-end are very large, (e.g. time period t1–t2 in FIG. 1) the effective zero, or low corner frequency (LCF), in the forward path is kept at a high frequency $F_1$. This filters away most of the write-to-read disturbances from reaching the output buffer 130, since the high frequency $F_1$ is higher than the frequencies of the write-to read disturbances, so maximum attenuation of the initial peak P (FIG. 1) is achieved. After the initial duration, the effective LCF in the forward path is moved through lower frequencies F2, F3, F4 generally corresponding to the times t2, t3, t4 in FIG. 1. Ultimately, the LCF reaches frequency Fn, where it is kept while the read channel is in the READ mode. This transition from F1 through $F_n$ corrects the long tail of the write-to-read disturbance. Thus, the LCF of the effective filter 155 in the forward path is moved in such a manner that the there is maximum attenuation when the magnitude and frequency of the disturbance is high (t1, t2) and lower attenuation when the amplitude and frequency of the disturbance is low (t5, t6, tn). The end point of the LCF is such that it doesn't interfere with normal reading of data; i.e. the frequency of the LCF is much lower than the data frequency.

The output of the LPF 135 is a voltage signal. A differentiator $Gm_f$ feedback stage 140 is included in the feedback path 165 to convert the voltage output of LPF 135 to a current for feeding back to the forward path at the output of the prior gain stage (in this case stage 115). Here, the feedback loop 165 is shown around the gain stage 120 instead of around the last gain stage 125.

Figure 4:
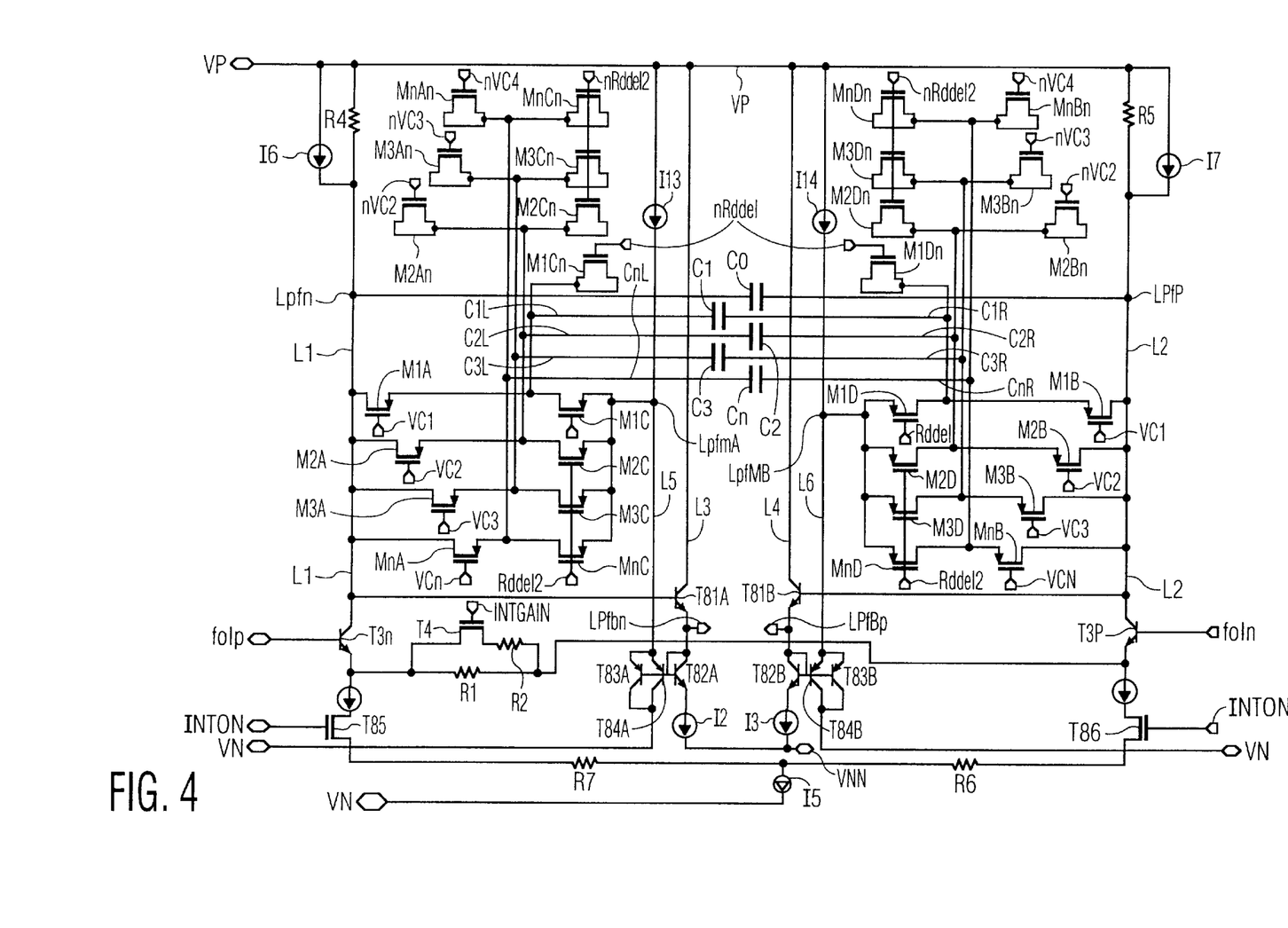
FIG. 4 is a circuit diagram of the LPF 135 with a switched capacitor network and with circuitry to charge balance as well as to minimize switching transients.

FIG. 4 is an embodiment of LPF 135 which includes a switched capacitor network to implement a variable capacitance.

FIG. 4 also includes a charge balance circuit as well as compensation circuit according to the invention. The LPF (also referred to as an integrator) includes a number of MOS switches and capacitors to vary the location of the pole of the LPF 135. The inputs to the LPF are voltage signals foln, folp, which are the differential outputs, from the stage $(Gm_{n+1})$ 120. The signals foln, folp are coupled to the bases of bipolar transistors T3p, T3n. The emitter of each of the transistors T3p, T3n is coupled to a current source I5 via respective resistors R6, R7, the output of current source I5 being coupled to a lower voltage suppler rail VN. The collector of the transistor T3n is coupled via line L1 to the output of a current source I6 which is coupled in parallel with a load resistance R4. Similarly, the collector of the transistor T3p is coupled via line L2 to a current source I7, also in parallel with a small load resistance R5. The purpose of the current sources I6, I7 is to effectively choose the operating point of nodes Ipfn, Ipfp (otherwise it would be (I5/2*RL) where (R4=R5=RL). The switched capacitor network is coupled between the lines L1 and L2 and includes a plurality of capacitors C0, C1, C2, C3, and Cn with capacitor C0 being fixed and the remaining capacitances being switchable. The capacitors C1, C2, C3, and Cn are coupled, respectively, to the lines L1 and L2 via MOS devices M1A, M1B; M2A, M2B; M3A, M3B and MnA, MnB. The gates of the devices M1A, M1B receive a control voltage VC1, the gates of the devices M2A, M2B receive a control voltage VC2, the gates of the devices M3A, M3B receive a control voltage VC3, and, likewise, the gates of the devices MnA, MnB receive a control voltage VCn. The control voltages are provided to selectively couple the capacitors C1–Cn between lines L1 and L2 to vary the location of the pole of LPF 135. The outputs of the LPF 135 are differential voltages Lpfbn, Lpfbp.

A key requirement of a preamplifier circuit with respect to entering the steady read mode is the absence of DC transients above 20 mV. In other words, the steady read mode is defined as beginning upon the last occurrence of a differential DC transient above this level. Accordingly, it is important that the switching of the capacitors in the LPF not induce differential DC transients. The present inventors recognized that this could occur if the voltage on each node of a capacitor C1–Cn in LPF 135 were different when that capacitor was switched into the circuit, as different voltages would cause the capacitor to discharge, rapidly creating transient currents. Additionally, it is important that prior to the initiation of the read mode the capacitances are not reflected to the nodes Lpfn, Lpfp, so that the pole of filter 135 starts at a high frequency (determined by the capacitor C0) prior to the capacitors C1–Cn being switched into the circuit.

FIG. 4 shows circuitry which equalizes the voltage on the nodes on either side of the capacitors C1–Cn prior to the capacitor being switched into the circuit. This charge balancing, or equalization, circuitry includes first and second emitter-followers as well as a number of equalization switches coupled to each side, or node, of the capacitors C1–Cn. The first emitter-follower consists of the transistor T81A and a current source I2. The transistor T81A is coupled in the branch L3 and has its emitter coupled to the collector of a diode connected transistor T82A. The base of the transistor T81A is coupled to branch L1, and is at the same potential as node Lpfn. Thus, the base of the transistor T82A is one diode drop below node Lpfn. The second emitter-follower consists of the transistor T84A, the transistor T83A in parallel to the transistor T84A, and a current source I13 (in branch L5). The transistor T83A has its base coupled to the base of the transistor T82A and its emitter coupled to the rail VP via the current source I13. The node LpfmA, between the current source I13 and the emitter of the transistor T83A is one diode drop above the base of transistor T82A, so is at the same voltage as node Lpfn. The difference in base-emitter voltages due to different currents and mismatches in transistors is accounted for by appropriate dimensioning of the transistors T82A, T83A to achieve voltage equivalence between nodes Lpfn and LpfmA. The transistors T81B, T82B, T83B, T84B are coupled in a corresponding manner to the circuit branches L2, L4, L6, so that the node LpfmB is at the same potential as node Lpfp in branch L2. The control gate of PMOS equalization transistors M1C, M1D are coupled to the input RdDel and the control gates of PMOS equalization transistors M2C, M2D; M3C; M3D and MnC; MnD are coupled to receive the signal Rddel2.

Figure 6:
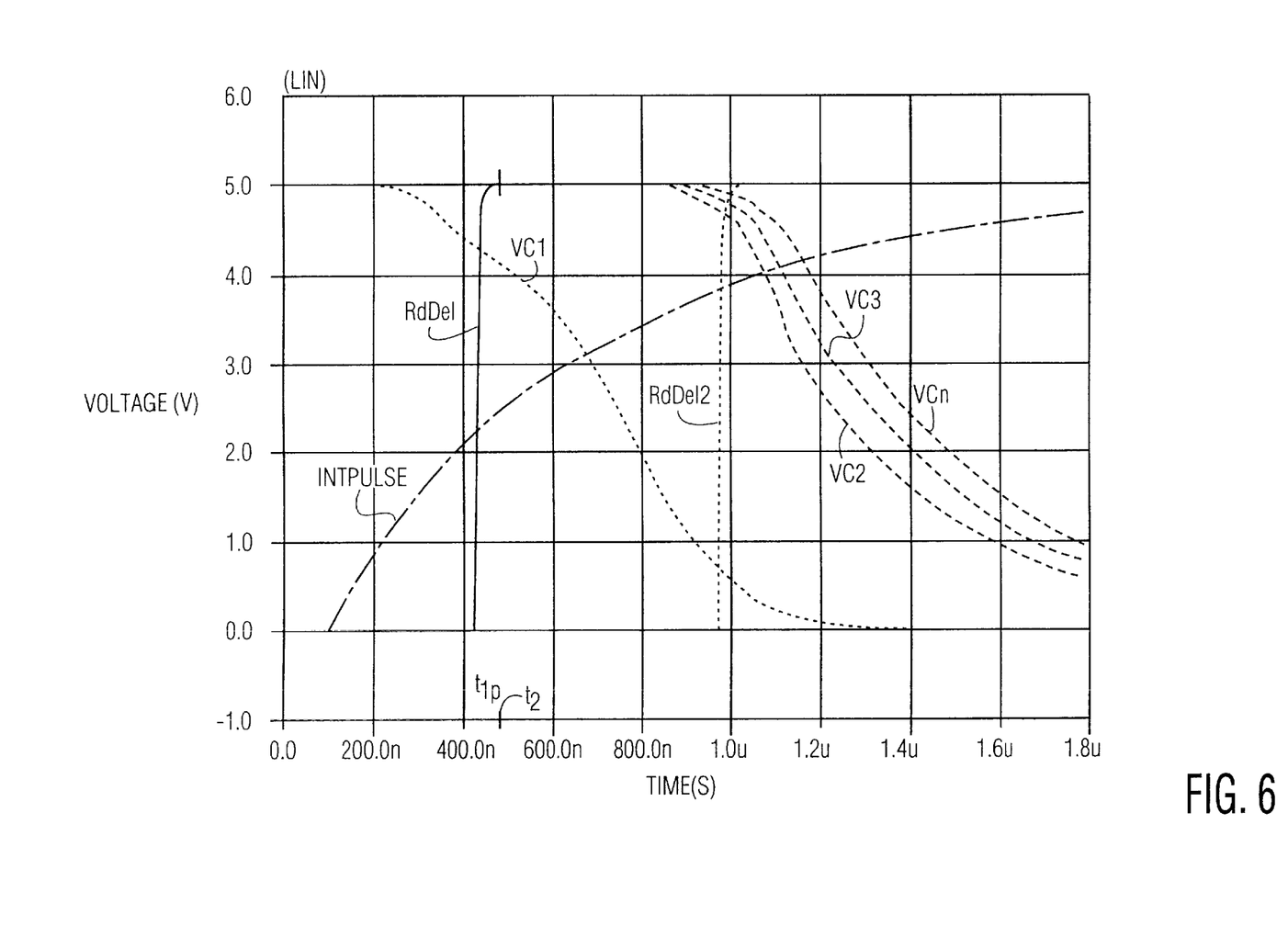
FIG. 6 is a graph illustrating the time-dependent qualities of certain control signals for the LPF 135.

With reference to FIG. 6, the signals VC1, VC2, VC3, VCn are initially logic high and the signals RdDel and Rddel2 are initially logic low. Thus, the switches M1A–MnA; M1B–MnB (used to switch the capacitors C1–Cn in/out of the LPF circuit) are initially off (non-conductive). The equalization switches M1C–MnC and M1D–MnD are initially conductive and couple each of the capacitors C1–Cn to the nodes LPFmA, Lpfmb. Both nodes or sides of each switched capacitor C1–Cn are coupled to the same DC potential thereby (as nodes Lpfma, Lpfmb are at the same potential as Lpfn, Lpfp respectively).

When the input Rddel goes logic high, switches M1C and M1D turn off, as signal VC1 goes low and switches M1A, M1B turn on to bring capacitor C1 into circuit. When signal VC1 turns switch M1A, M1B on, both sides of the capacitor C1 will have been at the same potential as those before switching, so DC switching transients are minimized. Note that devices C2–Cn are still decoupled from the filter in the AC sense by equalization switches M2C–MnC; M2D–Mnd and their corresponding emitter-followers so that their capacitance does not influence the relatively high pole determined by capacitance C1. Signal Rddel2 then goes logic high, turning equalization switches M2C–MnC off, and signals VC2–VCn then go logic low in succession to further reduce the pole frequency of LPF 135.

Consider the change of the corner frequency Fc of the LPF 135 in the time domain. At a first instant $t1=t_{1p}$ (illustrated in FIG. 6), the input RdDel goes logic high, switching off the equalization switches M1C, M1D. The pre-charge to the nodes C1L, C1R is then switched off and the voltage on each of these nodes are equal to Lpfn and Lpfp respectively. At a later instant $t2>t_{1p}$, input VC1 goes logic low and the transistors M1A, M1B become conductive. The nodes C1L, C1R will then have dc voltages which are the same as Lpfn, Lpfp, respectively. Hence, at time t1, there is no difference in voltage across the capacitor C1 due to the precharge, nor at time t2 after the capacitor C1 is switched in circuit.

Without the precharge mechanism according to the invention, the nodes C1l, C1R would assume some intermediate voltages V1, V2 respectively. When the input VC1 goes logic low, then the node C1l would see a differential of voltage from V1 to V(Lpfn). This would cause a transient current to flow at node C1L through the MOS transistor M1A and also through the load resistor R4. This implies that at the output of the filter, initially at nodes Lpfn, Lpfp as well as at output nodes Lpfbn, Lpfbp we would see spikes during the switching of control signal VC1 from logic high to logic low, that is during the time period that the corner frequency of LPF 135 is dynamically changing from a first frequency F1 to a lower frequency F2. Hence, the charge balancing mechanism according to the invention substantially reduces any voltage differential across the nodes C1L, C1R, and more particularly charges these nodes to the voltage they will be at immediately after being switched into circuit. This drastically reduces the above-mentioned current spikes (noise) at the output of the filter.

The explanation for the switching of the control signals VC1 and RdDel also applies to the switching of the subsequent control signals VC2, VC3 . . . VCn and RdDel2, in exactly the same manner.

Furthermore, because the nodes LpfmA, LpfmB are each coupled to the nodes Lpfn, Lpfp through two emitter followers (formed by the transistors T81A, T82A, T83A; T84A; T81B, T82B, T83B, T84B) the capacitance of devices C1–Cn as seen at filter nodes Lpfn, Lpfp is reduced by a factor of $\beta^2$ and are substantially not reflected to the nodes Lpfn, Lpfp, so that the cut-off frequency of filter 135 is primarily determined by the capacitance of capacitor C0. The equalization circuit therefore also provides isolation for each of the switched capacitors.

Switches M1C–MnC and M1D–MnD introduce gate-source and gate-drain capacitances into the LPF 135, and thus may introduce their own current transients upon switching. The transition of signals VC1, VC2 . . . VCn from logic high to logic low would cause a change in the charge stored on the gate-source capacitance Cgs of each corresponding MOS transistor M1A–MnA; M1B–MnB. The corresponding unwanted current is proportional to the rate of change of the charge in signals VC1–Vcn with respect to time and equals Cgs(dVci)/dt, where Vci is the voltage of any of the signals VC1–VCn, respectively. This current will flow through the source/drain of these MOS transistors, causing some unwanted disturbances at the output of LPF 135. A similar unwanted disturbance is caused by the signals Rddel and RdDel2.

Figure 7:
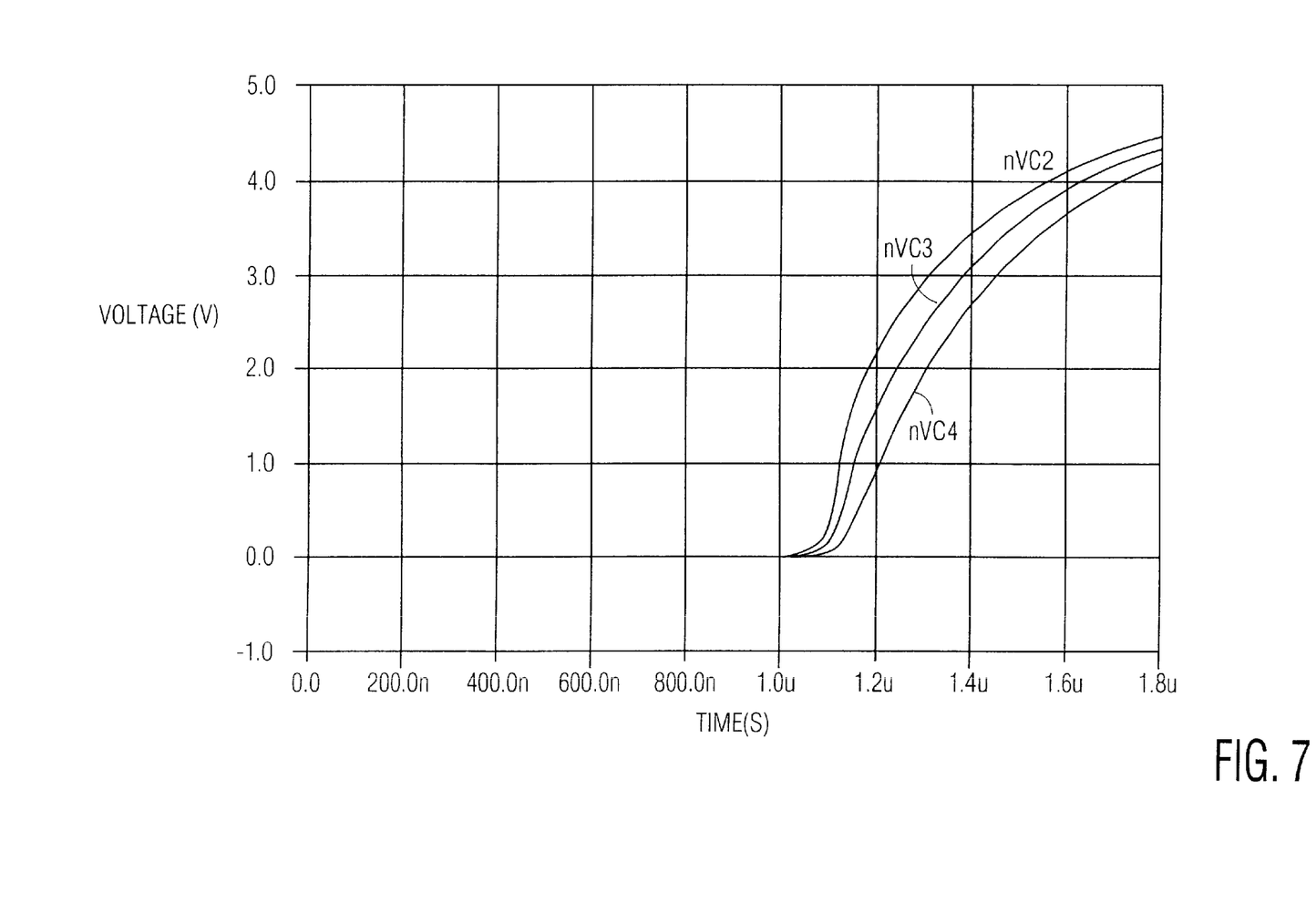
FIG. 7 is a graph illustrating corresponding compensation signals for the signals shown in FIG. 6.

To eliminate the above described disturbance, an equivalent MOS gate-source capacitance Cgs' is provided for each of the capacitor switching and equalization transistors, where Cgs' is ideally equal to Cgs. A compensation signal, switching in opposite direction to and at the same time as each of the signals VC1–Vcn; RdDel; RdDel2, is applied to each of the equivalent capacitances Cgs' to cancel the charges induced by these signals. These compensation signals are illustrated in FIG. 7.

FIG. 4 illustrates one implementation of this compensation scheme in which a number of compensating PMOS transistors (M2An–MnAn; M1Cn–MnCn; M2Bn–MnBn; M1Dn–MnDn) are provided corresponding to respective ones of the PMOS switches M2A–MnA; M1C–MnC; M2B–MnB; M1D–MnD. The compensating PMOS transistors have their drains coupled to their sources, effectively doubling their capacitive effect and allowing these compensating devices to be substantially reduced in size. Since the source and drains are connected to each other, these PMOS devices do not function as switches, but as capacitors, to effectively implement a compensation gate capacitance Cgs' ideally equal in magnitude to the gate capacitance of their respective PMOS capacitor switching or equalization transistor. The compensating PMOS devices are provided with a charging signal at their gates, at the same time their respective switching or equalizing PMOS switches are driven, which charging signal is selected to induce a charge therein of the opposite sense as the charge induced in the respective equalization switch when it is switched. In this manner, the charging signals can be selected to reduce transient currents based on the actual transients induced in the IC by the equalization switches, whereas a fixed compensating capacitor could not. Thus, the compensating CMOS devices minimize transients and ensure that the equalization circuitry doesn't degrade its own performance with respect to reducing the settling time of write-to-read disturbances.

Figure 5:
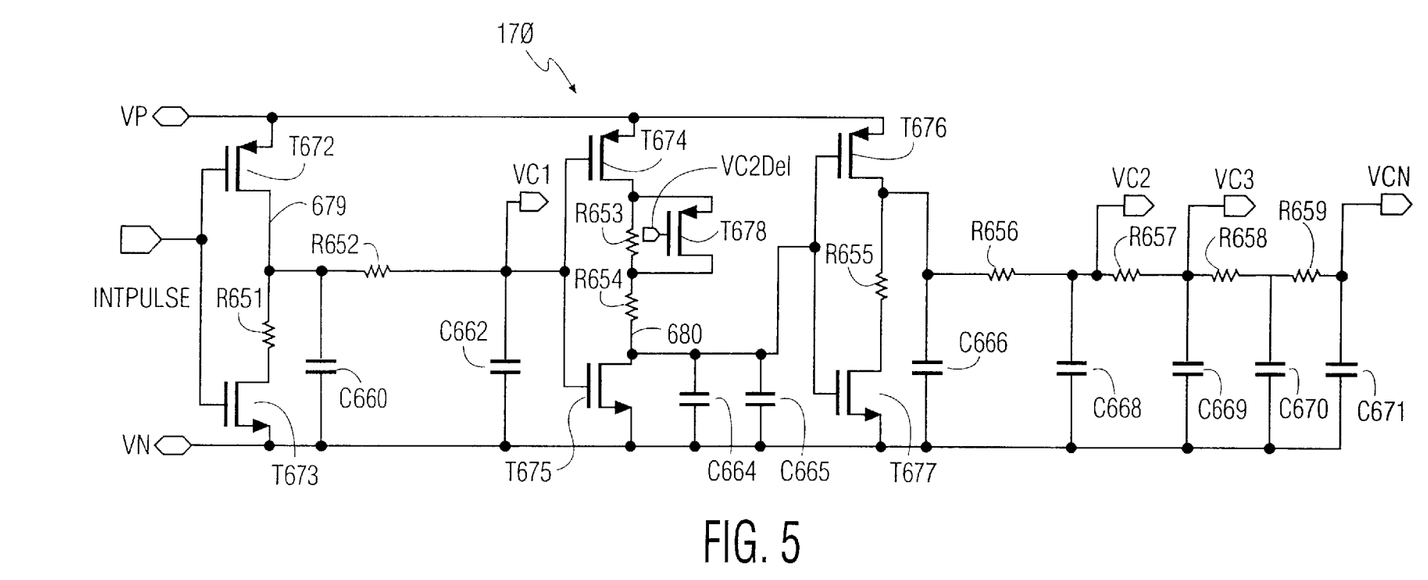
FIG. 5 is circuit diagram of an exemplary circuit 170 for generating the control voltages for the LPF 135.

In addition to the two above described techniques, the MOS switches in LPF 135 have to be switched very slowly, in order to minimize transients. FIG. 5 shows one possible implementation of a circuit 170 which generates the control voltages VC1–VCn to drive the gate of the MOS switches in LPF 135, to achieve the time-dependent movement of the pole of the LPF 135 from the initial relatively high frequency F1 to the lower frequency F2. In this example, an R-C ladder structure is used to generate the control voltages in response to a READ control signal received at the input RdDEL. The outputs of the circuit 170 are the control voltages VC1, VC2, VC3 and VCn which control the MOS switches of the variable capacitor circuit of LPF 135 (FIG. 4).

Note in FIG. 6 that the signal VC1 does not switch abruptly from logic high to logic low. Rather, it decays from one logic level to the other over a time period of about 1 microsecond. The signals VC2, VC3 . . . VCN decay in similar manner, as do the corresponding compensation signals of FIG. 7.

The READ control signal received at input INTPULSE drives the gates of a PMOS switch, T672 and an NMOS switch T673, which together define a switchable current path 679 between supply rails VP, VN through a resistor R651. The current path 679 is coupled to drive the gates of a second pair of PMOS, NMOS transistors T674, T675 via resistor R652. The capacitor C660 and the resistor R651, and the capacitor C662 and the resistor 652 define a first RC time constant. The transistors T674, T675 have main current paths which define a-second switchable current path 680 between rails VP, VN through serially coupled resistors R653, R654. The current path 680 is coupled to drive the gates of a third pair of PMOS, NMOS transistors T676, T677 which together similarly define a third switchable current path 681 through a resistor R655. The transistor T678, is coupled around the resistor R653. When a control signal VC2DEL is applied to the gate of the transistor T678 to render it non-conductive, a second RC time constant is defined by the combination of the two resistors R653, R654 and the two capacitors C664, C665. When a control signal VC2DEL is supplied to render the transistor T678 conductive, the resistor R653 is shunted and a fourth time constant is defined by the combination of the resistor R654 and the two capacitors C663, C664 which is shorter than the third time constant. The third and fourth time constants define the time period between when the switches T674, T675 turn on and when the switches T676, T677 turn on. The combination of a fifth time constant defined by the RC pair of a resistor R655 and a capacitor C666 and of a sixth time constant defined by the RC pair of a resistor R656 and a capacitor C668 controls the time period between the turning on of the switches T676, T677 and the generation of the control voltage VC3. Subsequent time constants which define the time lapse between the generation of the control signal VC4 and VC3, and between VCn and VC4 are defined by the further RC pairs R657, C669; R658, C670; and R659, C671.

The circuit 170 operates as follows. As illustrated in FIG. 6, when the input REDEL transitions from a logic low to a logic high (corresponding to a write-to-read transition), the switch T672 turns off and the switch T673 begins to turn on when RdDel reaches the threshold voltage of switch T673, about 0.7 V. This couples the lower supply rail VN to generate the control signal VC2 controlled by the RC time constant of the resistors R651, R652 and capacitors C660 and C662. The signal VC1, as shown in FIG. 6 is initially high, due to the previous state of the signal RdDel being logic low. As this signal VC1 decreases, the NMOS switch T675 turns off and the PMOS switch T674 turns on. This couples the gates of the further switches T676, T677 to the supply rail VP, which turns on the switch T677 and turns off the switch T676. When switch T677 turns on, the outputs VC2, VC3 through VCn are coupled to the rail VN, generating the control voltages VC2, VC3, VCn at these outputs with time delays based on the intervening time constants between the respective delay and the switch T677. The switch T678 serves as an adjustment switch to optionally change the time constants between the control signals VC1 and VC2, by switching creating a shunt around the resistor R653 with the control signal VC2del.

The control input signals INTPULSE, Rddel, and Rddel2 and control voltages VC1 to VC4 generated by circuit. 170 and driving the MOS switches in LPF 35 would typically appear as shown in FIG. 6. The slow switching signals for the MOS switches of the variable capacitor of FIG. 4 can be generated in several other ways, which could be easily implemented by those of ordinary skill in the art in view of the example of FIG. 5 and the waveforms of FIG. 6. However, an RC ladder circuit provides a relatively simple means to generate controls signals which (i) transition slowly from one logic level to another and (ii) which are separated from each other in the time domain. It should be understood that the compensation signals of FIG. 7 are also generated using corresponding RC-ladder circuits, like those of FIG. 5. As evident from comparing FIGS. 6 and 7, RC ladder circuits also provide an easy way to generate complementary signals (e.g. VC1, nVC1) with the same but opposite slopes, as necessary for effective cancellation of switching charges. Good matching of the resistors and capacitors in the ladder circuits generating the complimentary signals is obtainable by placing components close to each other on the integrated circuit.

Turning again to FIG. 4, the MOSFET switches T85, T86 receive signal INTON which controls whether the LPF 135 is on or off. The switch T4 receives a control signal INTGAIN, and switches the resistor R2 into and out of circuit with the resistor R1. The resistors R1, R2 determine the DC gain of LPF 135 and signal INTGAIN is used to switch the LPF 135 between a high and a low gain mode. This provides a different gain control mechanism than the switches capacitor circuit, which varies the pole of the LPF.

Accordingly, the present invention provides circuits and methods for reducing noise in switched capacitor networks and the filters in which they are used by (i) pre-charging to achieve charge balancing across switched capacitors, (ii) compensation of switching transients, and (iii) slowly decaying switching signals.

The process or technology by which the of the invention is made is not important and any of the standard bipolar, CMOS or BiCMOS processes can be used.

Although preferred embodiments of the present invention have been shown and described, it will be appreciated by those skilled in the art that changes may be made in these embodiments without departing from the principles and spirit of the invention, the scope of which is defined in the claims.

The many features and advantages of the invention are apparent from the detailed specification and it is intended by the appended claims to cover all such features and advantages which fall within the true spirit and scope of the invention. Since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. An integrated circuit, comprising:
a filter circuit having an input and a filtered output that is dependent upon the input and upon a capacitive value within a branch circuit of the filter circuit,
the filter circuit including:
at least one capacitive device having first and second terminals,
a switch circuit that is configured to selectively switch the at least one capacitive device into the branch circuit at corresponding first and second nodes in the branch circuit, thereby changing the capacitive value within the branch circuit, and
an equalization circuit, operably coupled to the at least one capacitive device, that is configured to set the first and second terminals to electric potentials that are substantially equal to potentials of the first and second nodes, respectively.

2. An integrated circuit according to claim 1, wherein the equalization circuit includes a respective isolation device coupled to each of the first and second terminals, to isolate the capacitive device from the filter circuit when the capacitive device is not coupled to the branch circuit via the switching circuit.

3. An integrated circuit according to claim 2, wherein the isolation device comprises first and second serially coupled emitter-followers.

4. An integrated circuit according to claim 1, wherein the switch circuit is configured to receive a control signal that controls switching the at least one capacitive device into the branch circuit, and
the control signal induces a transient current in the filter circuit when the control signal is received by the switch,
the filter circuit further including
a compensation circuit that is configured to generate a current of substantially equal and opposite magnitude to the transient current, to thereby substantially cancel the transient current at the output.

5. An integrated circuit according to claim 4, wherein the compensation circuit includes a capacitive compensation device, the capacitive compensation device receiving a compensation signal to generate the compensation current.

6. An integrated circuit according to claim 5, wherein the switch circuit includes a MOS transistor having a gate-source capacitance, and
the switch capacitance substantially corresponds to the gate-source capacitance.

7. An integrated circuit according to claim 5, wherein the capacitive compensation device is a MOS transistor having a drain, and a source coupled to the drain.

8. An integrated circuit according to claim 4, further comprising
a control circuit that generates the control signal and the compensation signal.

9. An integrated circuit according to claim 1, further comprising
a control circuit that generates a control signal that controls the switching circuit.

10. An integrated circuit according to claim 9, wherein the control circuit generates the control signal to transition relatively slowly from a first logic level to a second, different logic level, to minimize switching transients.

11. An integrated circuit according to claim 10, wherein the control circuit comprises a R-C ladder circuit that generates the control signals.

12. An apparatus, comprising:
an input and an output, the output being dependent upon the input, and upon a capacitive value of a variable capacitance circuit,
the variable capacitance circuit comprising:
a plurality of capacitive means;
a plurality of switch means each for selectively coupling corresponding ones of the plurality of capacitive means with other ones of the plurality of capacitive means, thereby selectively changing the capacitive value of the variable capacitance circuit, each of the switch means inducing a transient current in the variable capacitive circuit when selectively coupling the corresponding ones of the plurality of capacitive means; and compensation means for generating a compensating current of substantially equal and opposite magnitude as the transient current, to thereby substantially cancel effects of the transient current at the output upon switching of each of the switching means.

13. An apparatus according to claim 12, wherein the compensation means includes:

a plurality of MOS transistors corresponding to the switching means, and compensation signal generating means for selectively applying compensation signals to at least one of the plurality of MOS transistors to generate the compensation current.

14. A method of operating a variable capacitance circuit to reduce noise at an output thereof, the variable capacitance circuit including a plurality of capacitive devices and a plurality of switches that selectively couple the capacitive devices with each other, the method comprising:

providing a compensation device corresponding to at least one switch of the plurality of switches;

applying a control signal to render the at least one switch conductive, the control signal inducing a transient current in the variable capacitance circuit; and applying a compensation signal to the compensation device, concurrently with the application of the control signal to the at least one switch, to generate a compensation current of substantially equal and opposite magnitude to the transient current, to thereby substantially cancel the effects of the transient current at the output of the variable capacitance circuit.

15. A method according to claim 14, further comprising:

coupling the variable capacitance circuit to nodes of a filter, to selectively vary a corner frequency of the filter; and prior to applying the control signal to the at least one switch, providing an electric potential across a capacitor of the plurality of capacitive devices that is coupled to the switch to correspond to a potential between the nodes of the filter.

16. A method according to claim 15, further comprising isolating a capacitive device of the plurality of capacitive devices from an output of the variable capacitance circuit with first and second emitter-followers coupled electrically in series.

17. A method according to claim 14, further comprising isolating a capacitive device of the plurality of capacitive devices from an output of the variable capacitance circuit with first and second emitter-followers coupled electrically in series.

* * * * *

Disclaimer

6,400,217 B1 — Sanjay Manohar Bhandari, Sunnydale, CA (US). INTEGRATED CIRCUIT HAVING A FILTER WITH CHARGE BALANCING SCHEME TO REDUCE TRANSIENT DISTURBANCES. Patent dated June 4, 2002. Disclaimer filed March 28, 2008, by the assignee, Koninklijke Philips Electronics N.V.

Hereby enters this disclaimer to all claims of said patent.

*(Official Gazette, April 7, 2009)*